United States Patent [19]

Jang

[11] Patent Number: 5,684,748

[45] Date of Patent: Nov. 4, 1997

[54] CIRCUIT FOR TESTING RELIABILITY OF CHIP AND SEMICONDUCTOR MEMORY DEVICE HAVING THE CIRCUIT

[75] Inventor: Tae-Seong Jang, Busan, Rep. of Korea

[73] Assignee: Samsung Electronics Co., Ltd., Suwon, Rep. of Korea

[21] Appl. No.: 366,586

[22] Filed: Dec. 30, 1994

[30] Foreign Application Priority Data

Dec. 31, 1993 [KR] Rep. of Korea ............... 31785/1993

[51] Int. Cl.⁶ ............................................. G11C 7/00
[52] U.S. Cl. ............................................. 365/201; 371/21.1
[58] Field of Search .................... 365/201; 371/21.1

[56] References Cited

U.S. PATENT DOCUMENTS

5,321,659  6/1994  Taguchi ........................... 365/207
5,337,270  8/1994  Kawata et al. .................. 365/207
5,488,583  1/1996  Ong et al. ....................... 365/201

Primary Examiner—David C. Nelms
Assistant Examiner—F. Niranjan
Attorney, Agent, or Firm—Cushman Darby & Cushman, IP Group of Pillsbury Madison & Sutro LLP

[57] ABSTRACT

A test circuit shortens test time during testing reliability of a chip. The test circuit comprises a bit line level sensing circuit connected to a bit line and transferring data in response to a voltage level of the data when a memory cell data is transferred to the bit line, a bit line level sensing control circuit for controlling a driving operation of the bit line level sensing circuit, and transfer device for transferring the data transferred from the bit line level sensing circuit to an outside of the chip, so that the test circuit tests whether the memory cell is defective or not.

15 Claims, 7 Drawing Sheets

CIRCUIT FOR TESTING RELIABILITY OF CHIP AND SEMICONDUCTOR MEMORY DEVICE HAVING THE CIRCUIT

BACKGROUND OF THE INVENTION

The present invention relates to a semiconductor memory device, and more particularly to a test circuit capable of shortening test time during testing reliability of a chip.

A semiconductor memory device such as a dynamic RAM and a static RAM, has a test operation to check reliability of internal circuits before or after a package process of a chip. Meantime, in proportion to the increase in integrated density of the semiconductor memory device, test time is increased. In case of an initial semiconductor memory device, i.e., a semiconductor memory device having the integrated density below 1M grade (mega: $22^{20}$), the test time is not important because the test time is shorter than time required to produce the chip. However, in case of the semiconductor memory device over 64M or 256M grade, the importance of test time is relatively increased according to the increase of the number of memory cells together with improvement in process. Therefore, the test time functions as a fact to increase time required for producing the chip. As a result, the cost per unit of production becomes high and the production date becomes long. In the meantime, the test method of the semiconductor memory device to be used at present is known as a parallel test method. This method is sharply affected by the number of data input/output lines which transfer memory cell data within a cell array. That is, when a word line was enabled, whether how much the memory cell data is simultaneously transferred to the input/output line by a column selection line CSL (CSL: Column Selection Line) is dependent on a driving capability. Such a method requires much time to test all the cell arrays within the chip because the number of data input/output lines is limited in the chip architecture. The test method based on the parallel test method is disclosed in "A 90 ns 1 Mb DRAM with Multi-bit Test Mode", on pages 240 to 241 of a Paper "IEEE INTERNATIONAL SOLID-STATE CIRCUITS CONFERENCE DIGEST OF TECHNICAL PAPERS". With reference to figures, the art is explained as follows.

Figure 1:
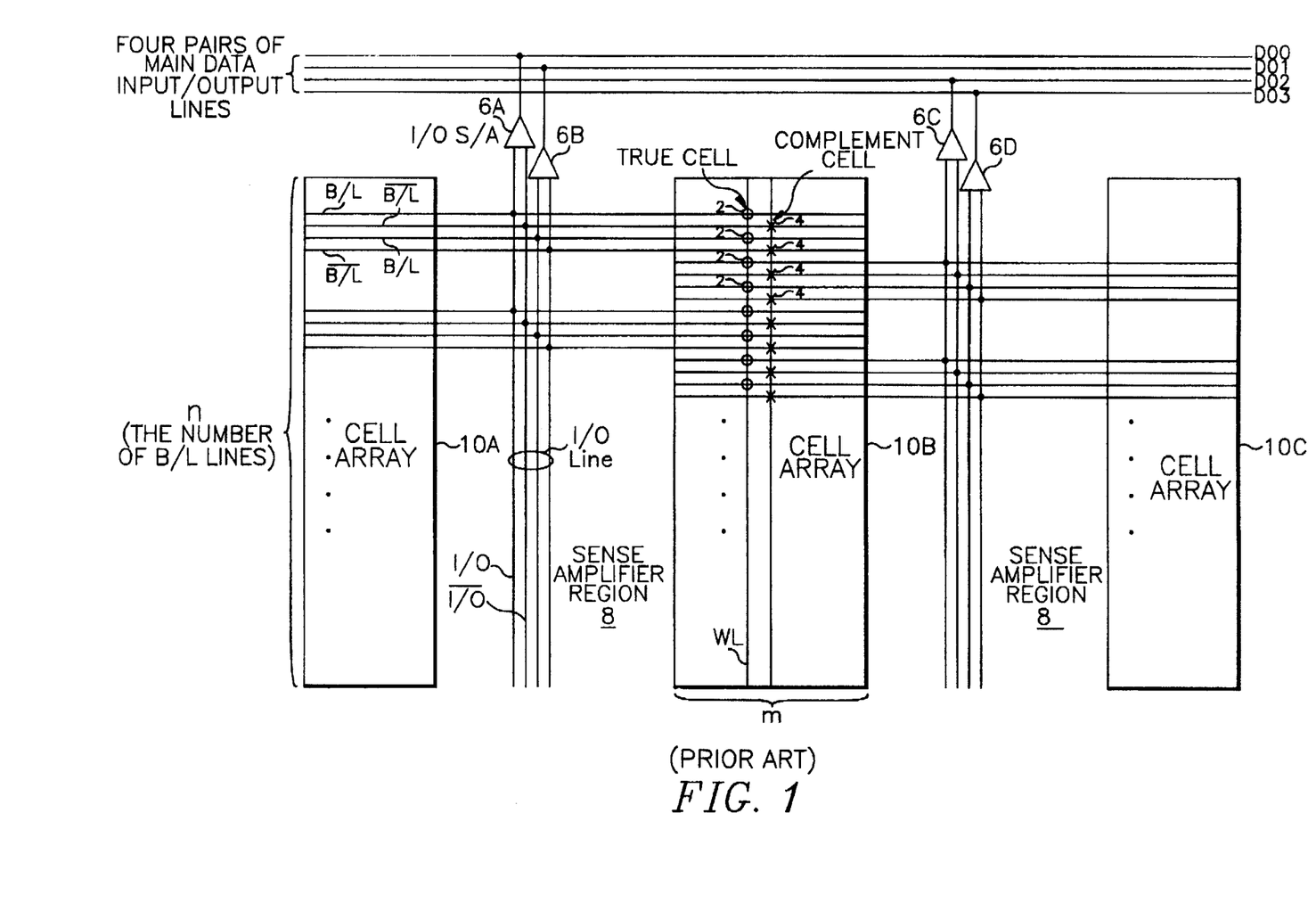
FIG. 1 is a circuit view showing a connection relationship between a cell array and a data input/output line according to the conventional art.

FIG. 1 shows an embodiment of a parallel test method in a construction that two pairs of input/output lines are arranged in a sense amplifier area, i.e., between cell arrays adjacent to each other, and that the cell array is composed of m row and n column. In such a construction, if any one of the word lines WL disposed in the cell array 10B is enabled, the memory cell data coupled to the word line WL is transferred to bit lines BL and $\overline{BL}$. The data of the bit lines BL and $\overline{BL}$ is transferred through the sense amplifier (not shown), and thus the bit lines BL and $\overline{BL}$ are each developed to the logic "high" and "low" levels or the logic "low" and "high" levels. Between the input/output lines I/O and $\overline{I/O}$ and the bit lines BL and $\overline{BL}$, a channel is formed through a column gate (not shown) controlled by the column selection line CSL. Therefore, the data of the bit lines BL and $\overline{BL}$ is transferred to the input/output lines I/O and $\overline{I/O}$ and then is again developed through differential amplifier operations of the input/output line amplifiers 6A, 6B, 6C, and 6D. The data amplified through the input/output line amplifiers 6A, 6B, 6C, and 6D is transferred and outputted to a data output stage circuit through main data input/output lines DO0, DO1, DO2, and DO3. Meanwhile, assuming that four pairs of main data input/output lines DO are provided in cell array, in case that the data input/output line sense amplifiers 6A, 6B, 6C, and 6D are simultaneously enabled and that two of the column selection lines are enabled, the cell data can be simultaneously transferred to the four pairs of main data input/output lines D0.

Figure 2:
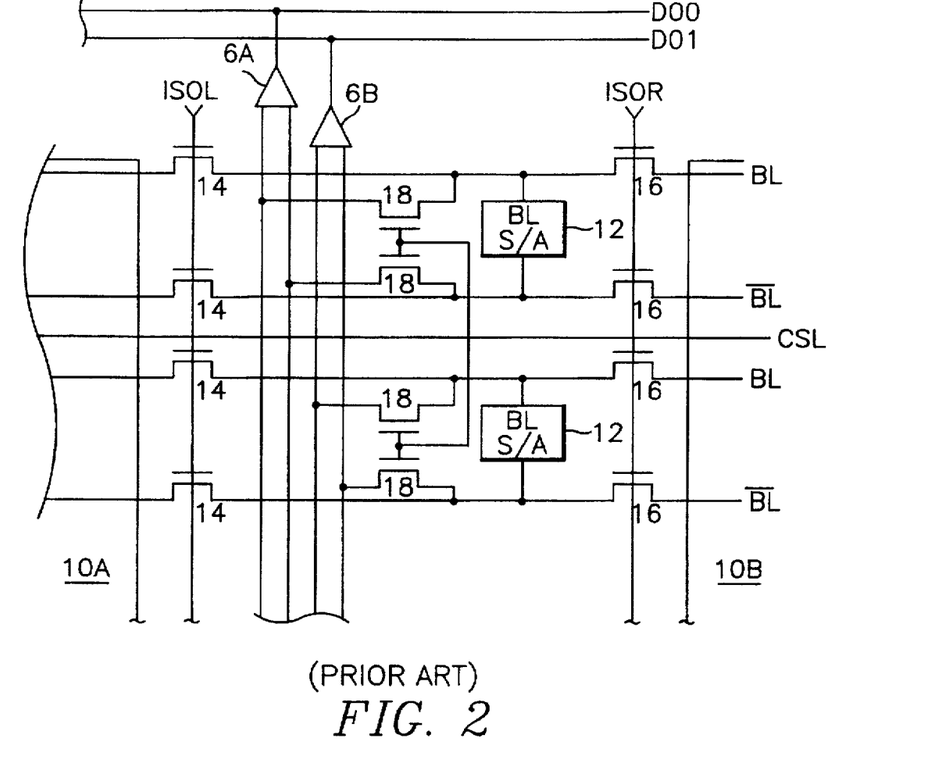
FIG. 2 is a circuit view showing a partial construction of a data transfer circuit of FIG. 1.

FIG. 2 shows in brief a data transfer circuit illustrating an construction of a column selection line associated with a bit line sense amplifier. In the construction of FIG. 2, two blocks indicated by reference numeral 12 indicate bit line sense amplifiers. Portions indicated by reference numeral 18 indicate data input/output transistors transferred between the input/output lines I/O and $\overline{I/O}$ and the bit lines BL and $\overline{BL}$ or indicate column gates controlled by a signal of the column selection line CSL. Portions indicated by reference numerals 14 and 16 indicate disconnecting gates for disconnecting the cell arrays 10A and 10B. Meantime, if the column selection line CSL is enabled, the data of the bit lines BL and $\overline{BL}$ is transferred to the input/output lines I/O and $\overline{I/O}$ through the column gate 18. From that, a state of the cell data is detected by driving of the input/output sense amplifiers 6A, 6B, 6C, and 6D. At this time, a detecting operation of the cell data is performed through a NAND gate and a NOR gate which are each coupled to the main data input/output line like FIG. 3.

Figure 3:
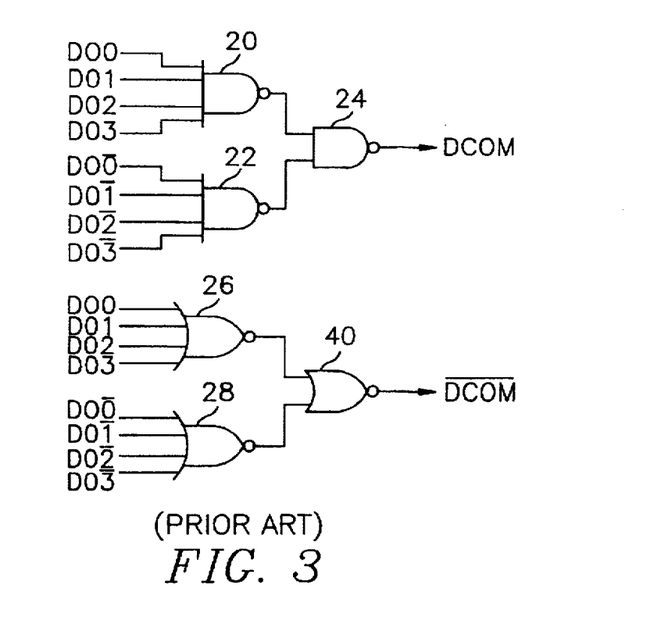
FIG. 3 is a circuit view showing a detecting device for discriminating defectiveness of data transferred through a main data input/output line of FIG. 1.

With reference to the detailed detecting operation, in order to test the memory cell, "1" data or "0" data is written in all the memory cells on same chip. For example, assumed that "1" data is written in all the memory cells. The word line WL is enabled and thus the cell data is transferred to the bit lines BL and $\overline{BL}$. Further, the data developed by the bit line sense amplifier is transferred to the input/output lines I/O and $\overline{I/O}$ through the column gate 18, and thus the data is amplified and transferred to the main data input/output line DO by the driving of the input/output sense amplifiers 6A and 6B. At this time, if the data of the main data input/output lines DO0, DO1, DO2, and DO3 is the same level to each other, the main data input/output lines DO0, DO1, DO2, and DO3 or $\overline{DO0}$, $\overline{DO1}$, $\overline{DO2}$, and $\overline{DO3}$ are the same level to each other among themselves. Then, if any one has different level, an output DCOM of a NAND gate 24 of FIG. 3 is at the low level and contrary an output $\overline{DCOM}$ of a NOR gate 40 is at the high level. From the above fact, it is possible to know defectiveness of the cell. On the other hand, even in the other case that "0" cell data is written, the defectiveness of the memory cell can be easily known through a series of processes mentioned above. Therefore, according to such a method, two column selection lines can be enabled in a period of test cycle, and if the cycle time is about 100 ns, the test time required to test all the memory cells arranged in one word line is necessary by (n/4×100)[ns]. Here, since two column selection lines are enabled, four data is input-output in one cycle. Assuming that i memory cell array is arranged, the test time required to test all the memory cells arranged on the same chip, is necessary by i×m×(n/4×100) [ns]. Consequently, the test time is enough long by the limited number of data input lines. Further, the test time becomes long in proportion to the increase of the integrated density of the semiconductor memory device.

SUMMARY OF THE INVENTION

It is therefore object of the present invention to provide a semiconductor memory device in which test time is shortened.

It is another object of the present invention to provide a semiconductor memory device capable of simultaneously testing all memory cells connected to same word line when a word line is once enabled.

It is still another object of the present invention to provide a semiconductor memory device capable of testing a memory cell regardless of a switching operation of a column selection gate.

It is further object of the present invention to provide a test circuit of a semiconductor memory device capable of shortening test time by simultaneously testing all memory cell connected to same word line when a word line is once enabled.

It is still further object of the present invention to provide a test circuit of a semiconductor memory device performing at high speed a test operation of a memory cell regardless of the number of data input/output lines.

The present invention according to the above objects is to provide a semiconductor memory device having a test circuit to test reliability of a memory cell.

The test circuit of the semiconductor memory device according to the present invention has a bit line level detector which is formed in each of the bit lines to test reliability of the memory cell.

The test circuit of the semiconductor memory device according to the present invention has a transfer device for transferring each of outputs of the bit line level detector to the outside of the chip, the bit line level detector corresponding to a state of the memory cell transferred to each of the bit lines during test of the memory cell.

The test circuit according to the present invention will not use a typical data input/output line and a column gate, which will be in detail explained hereinafter.

BRIEF DESCRIPTION OF THE DRAWINGS

The above and other objects, advantages and features of the present invention will be more apparent from the following detailed description taken with the attached drawings in which.

DETAILED DESCRIPTION OF THE PREFERRED EMBODIMENT

In the following description, specific details such as a bit line level detector, a bit line level detection controller and an amplifier circuit are set forth to provide a more thorough understanding of the present invention. It will be apparent, however, to one skilled in the art, that the present invention may be practiced without these specifics details or other change in form.

The test circuit according to the present invention is capable of detecting whether one or more memory cells are defective by defectiveness of any word line. According to the above fact, a repair method is achieved by a conventional row redundancy which repairs as a spare word line the word line discriminated as defectiveness.

Figure 4:
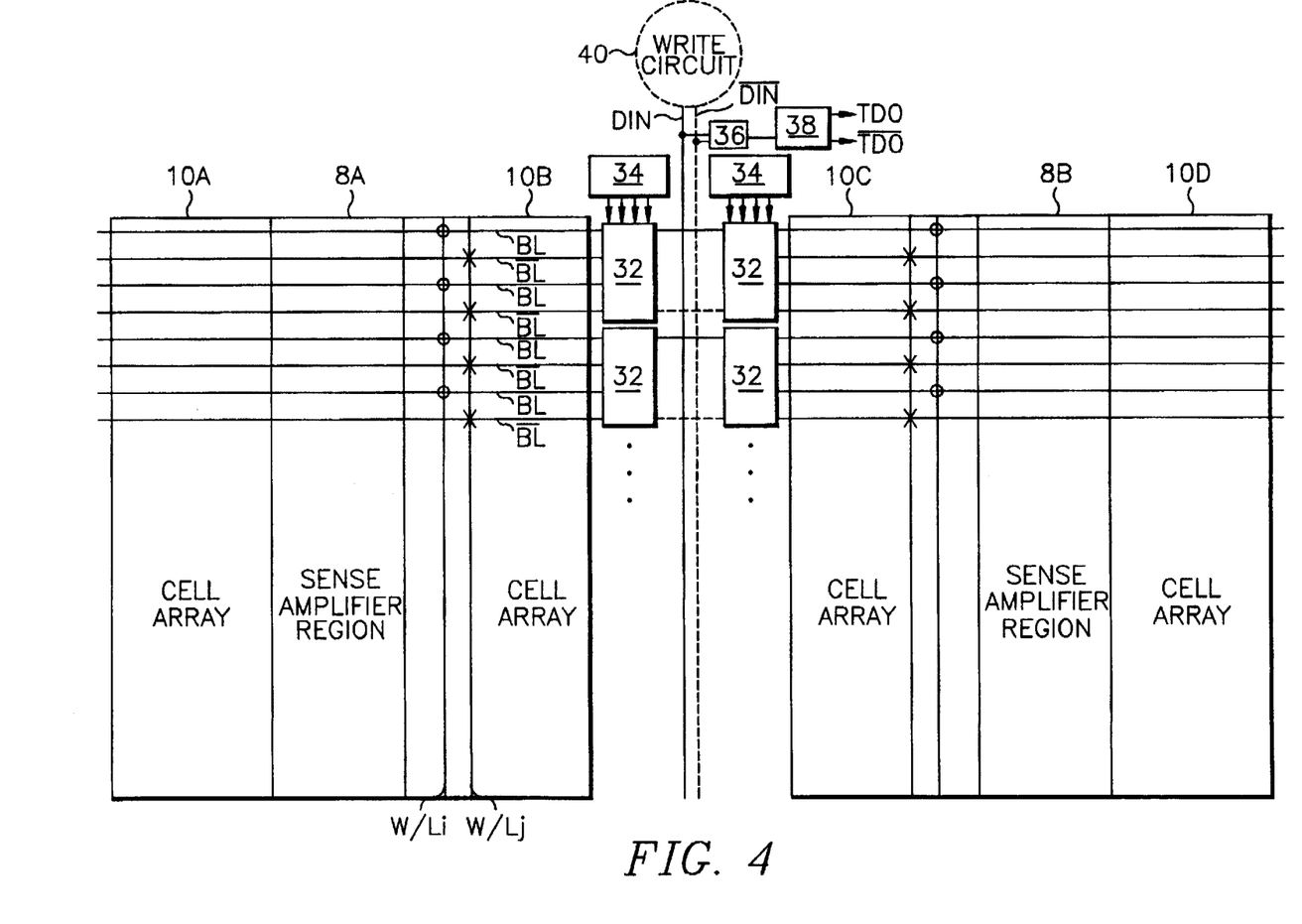
FIG. 4 is a schematic block diagram of a test circuit according to the present invention.

FIG. 4 shows a schematic block diagram of a test circuit according to the present invention. In addition to a construction that four cell arrays and two sense amplifier regions formed between the two cell arrays are shown, the test circuit is shown in FIG. 4. Here, it can be changed the numbers of cell arrays and sense amplifier regions, and the numbers of word lines and bit lines arranged on the cell arrays. In the meantime, the data input/output line or the column gate is formed in the sense amplifier regions 8A and 8B, the data input/output line implementing the test circuit in the conventional art. However, the test circuit according to the present invention is constructed without using the data input/output line or the column gate, unlike the conventional art. According to the present invention, the test circuit has a bit line level detector 32 connected to the bit line and sensing a voltage level of the corresponding bit line during a test operation, a bit line level detection controller 34 for controlling an operation of the bit line level detector during the test operation, a precharge circuit 36 for precharging an output node of the bit line level detector 32 in order to perform the test operation, and an amplifier circuit 38 for amplifying an output of the bit line level detector 32 and then for transferring it to an outside. Moreover, FIG. 4 further has a write circuit 40 for writing a desired data in each of the bit lines through the data input lines DIN and $\overline{DIN}$, the write circuit being constructed as a circuit for writing by a designer a desired level in the memory cell. In the construction of FIG. 4, the bit line level detector 32 and the bit line level detection controller 34 are components to implement the test circuit according to the present invention. Further, in case that the logic of the defective information applied to the data input lines DIN and $\overline{DIN}$ is stable regardless of loading of the data input lines DIN and $\overline{DIN}$, an amplifier circuit 38 may be removed from the construction of FIG. 4.

The embodiments of the components of the test circuit of FIG. 4 are as follows.

Figure 5:
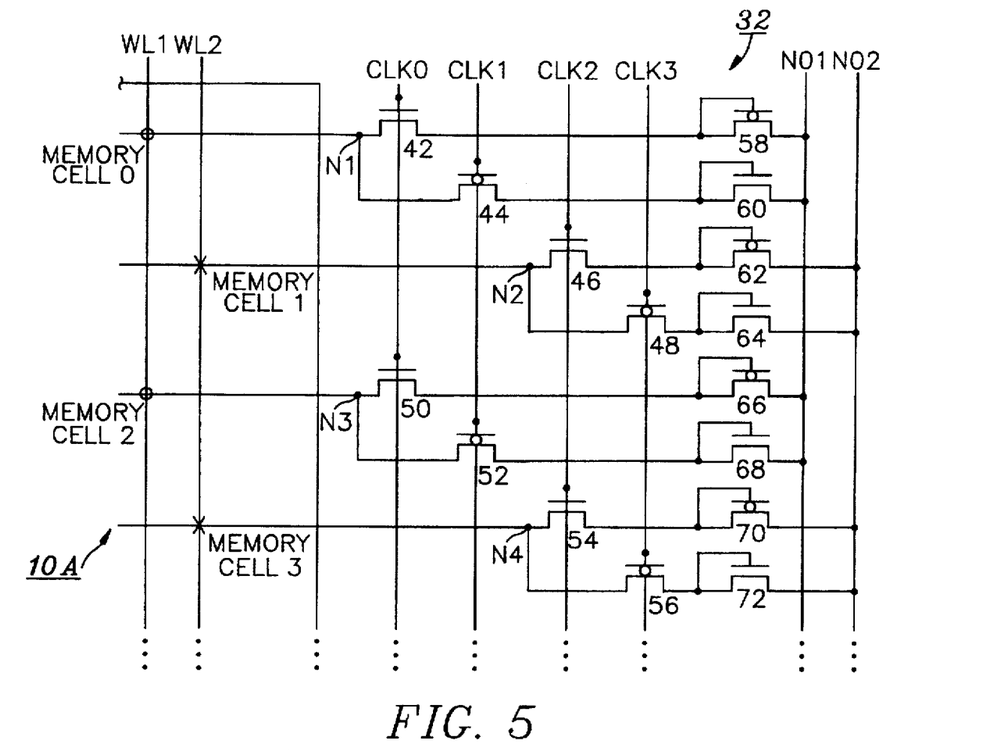
FIG. 5 is a circuit view showing an embodiment of a bit line level detector 32 of FIG. 4.

FIG. 5 shows the embodiment of the bit line level detector 32 of FIG. 4. In the construction of FIG. 5, level sensing transistors 42, 44, . . . , 72 are coupled to the bit lines to which the memory cells is connected, the level sensing transistors having the bit line level detectors. Further, the level sensing transistors 42, 44, . . . , 72 are connected to transfer lines N01 and N02 to transfer the level sensed during the test operation and the other level sensing transistors formed in the bit lines which are adjacent to each other, are connected to the other transfer lines. CLK0, CLK1, CLK2, and CLK3 are bit line level detection control signals and will be explained in FIG. 6. The signals CLK0 and CLK 2 are input at the low level in the initial stage and the other signals CLK1 and CLK3 are input at the "high" level. The transistors 58, 60, . . . , 72 operate as all the diode transistors. For example, the level sensing transistor 42 consisting of an NMOS transistor and the level sensing transistor 58 consisting of a PMOS transistor are connected to an connecting node n1 formed in the bit line coupled to the memory cell 0. Data transferred through the two transistors is coupled to the transfer line N01. Meanwhile, the level sensing transistor 44 consisting of the PMOS transistor and level sensing transistor 60 consisting of the NMOS transistor are connected to the connecting node n1. Data transferred through the two transistors is coupled to the transfer line N01. As shown, the rest of level sensing transistors are coupled to the other bit lines and their constructions are repeated like the above. In the meantime, the transfer lines N01 and N02 indicate the data input/output lines DIN $\overline{\text{DIN}}$ in FIG. 4. The bit line level detecting operation according to the construction is as follows. In order to test the chip, if "1" data (this means the logic "high" level) is written in all the memory cells which are arranged on the same chip, the voltage level of the bit line BL connected to the memory cell will be "1" data and that of the complementary bit line will be "0" data (this means the logic "low" level). Here, the memory cells connected to the same word line have the same logic level to each other. Therefore, if a data value stored in any one memory cell connected to the word line WL1 is "1", the other data value stored in the rest of memory cells connected to the word line WL1 becomes "1". At this time, assumed that the stored data value is "0" according to the generation of the defectiveness of the memory cell 0 and that there is no defectiveness in the other memory cell 2. In this case, the bit line connected to the memory cell 0 becomes the logic "low" level during the detecting operation and the bit line connected to the memory cell 2 will be developed to the logic "high" level during the detecting operation. At this time, if the bit line level detection controller CLK0 is provided at the high level, the level sensing transistors 42 and 50 are each turned on. Accordingly, the level sensing transistor 58 is turned on and the other level sensing transistor 66 is turned off. Further, assuming that the transfer line N01 is precharged to the "high level, the transfer line N01 is charged to the "low" level by the defectiveness of the memory cell 0. Thereby, it is possible to sense the defectiveness of the memory cell. On the other hand, if the data value stored in any one memory cell connected to the word line WL1 is "0", the data value stored in the rest of memory cells connected to the word line WL1 becomes "0". At this time, assumed that the data value is "1" due to generation of the defectiveness of the memory cell 0 and that there is no defectiveness in the other memory cell 2. In this case, the bit line connected to the memory cell 0 becomes the logic "high" level during the sensing operation and the bit line connected to the memory cell 2 will be developed to the logic "low" level during the sensing operation. At this time, if the bit line level sensing control signal CLK1 is provided at the logic "low" level, the level sensing transistors 44 and 52 are each turned on. Therefore, the level sensing transistor 60 is turned on and the other level sensing transistor 68 is turned off. Further, assuming that the transfer line N01 is precharged to the logic "low" level, the transfer line N01 is changed to logic "high" level by the defectiveness of the memory cell 0. Thereby, it is possible to sense the defectiveness of the memory cell. Meanwhile, it is easily expected that the bit line level detecting operation like the above is commonly performed in the other word lines and the other bit lines.

Figure 6:
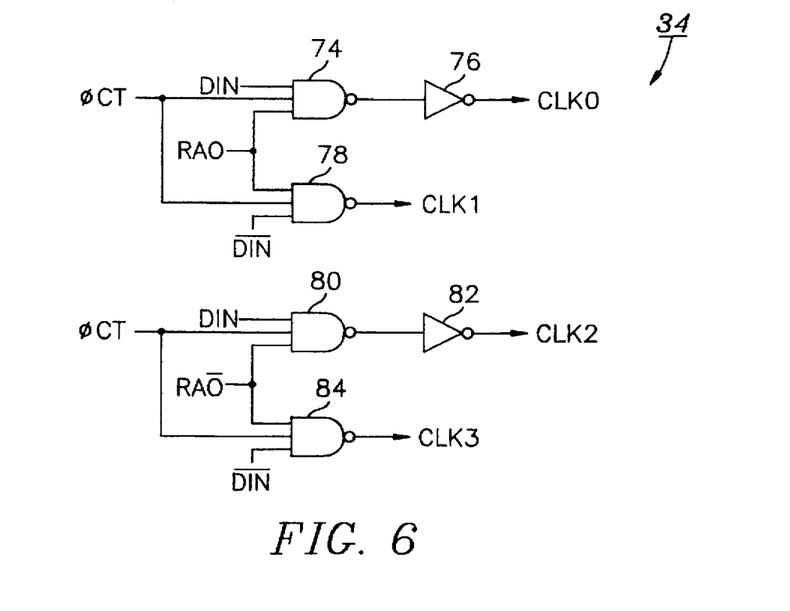
FIG. 6 is a circuit view showing an embodiment of a bit line level detector controller 34 of FIG. 4.

FIG. 6 shows the embodiment of the bit line level sensing control circuit 34 for outputting the signals CLK0, CLK1, CLK2, and CLK3 which control the bit line level detector 32 of FIG. 5. In the construction of FIG. 6, an input signal φCT is enabled during the test operation of the chip. That is, the bit line level detection controller 34 has a NAND gate 74 for each inputting the chip test enable signal φCT, a data input signal DIN, and a least significant address RA0, i.e., LSB (Least Significant Bits), an inverter 76 for inputting an output signal of the NAND gate 74 and outputting the signal CLK0, a NAND gate 78 for each inputting the chip test enable signal φCT, a data input reverse signal $\overline{\text{DIN}}$, and the least significant address RA0 and outputting the signal CLK1, a NAND gate 80 for each inputting the chip test enable signal φCT, the data input signal DIN, and the least significant address $\overline{\text{RA0}}$, an inverter 82 for inputting an output signal of the NAND gate 82 and outputting the signal CLK2, and a NAND gate 84 for each inputting the chip test enable signal φCT, a data input reverse signal $\overline{\text{DIN}}$, and the least significant address $\overline{\text{RA0}}$, and outputting the signal CLK3. The corresponding outputs of the bit line level detection controller signals CLK0, CLK1, CLK2, and CLK3 are represented as the following <Table 1>. Here, a "L" indicates the logic "low" level, and a "H" the logic "high" level.

TABLE 1

| INPUT SIGNAL | | | OUTPUT SIGNAL | | | |
|---|---|---|---|---|---|---|
| φCT | DIN | RA0 | CLK0 | CLK1 | CLK2 | CLK3 |
| 0 | 0 | 0 | L | H | L | H |
| 0 | 0 | 1 | L | H | L | H |
| 0 | 1 | 0 | L | H | L | H |
| 0 | 1 | 1 | L | H | L | H |
| 1 | 0 | 0 | L | H | H | H |
| 1 | 0 | 1 | L | L | L | H |
| 1 | 1 | 0 | L | H | L | L |
| 1 | 1 | 1 | H | H | L | H |

As shown in <Table 1>, if the chip test enable signal φCT becomes the logic "low" level, all the level sensing transistors 42, 44, . . . , 56 constructing the bit line level detector 32 of FIG. 5 are turned off, the bit line level detector being disconnected to each of the bit lines. The <Table 1> shows the corresponding output to each of the input signals. Therefore, the operations associated with the corresponding output will not be explained.

Figure 7:
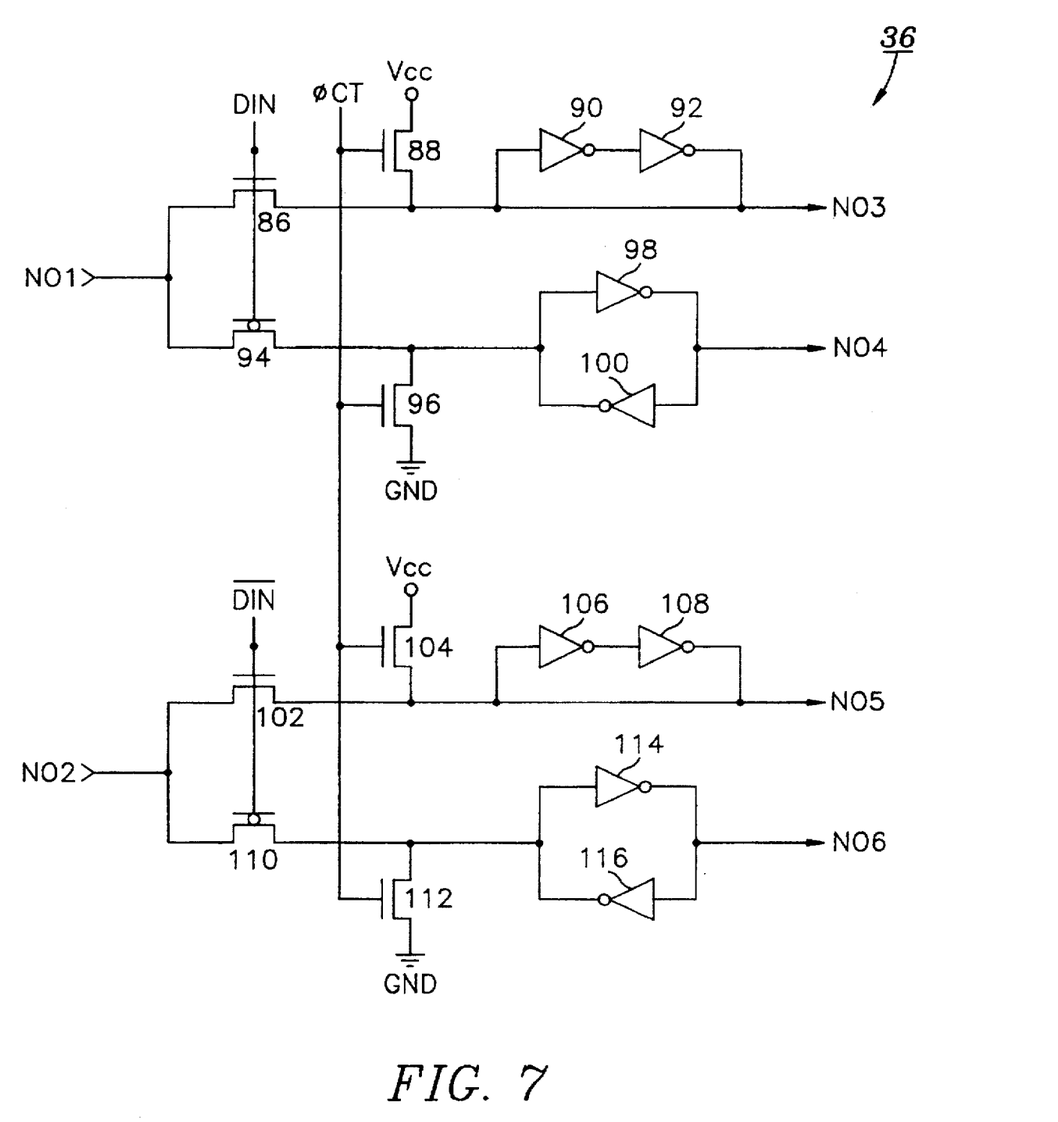
FIG. 7 is a circuit view showing an embodiment of a precharge circuit 36 of FIG. 4.

FIG. 7 shows the embodiment of the precharge circuit 36 of FIG. 4. The precharge circuit 36 of FIG. 7 is constructed as an intermediate process of transferring the defectiveness detected from the bit line level detector 32 of FIG. 4 to the amplifier circuit 38. In the construction of FIG. 7, an NMOS transistor 86 has a channel formed between the transfer lines N01 and N03 and gate-inputs the data input signal DIN. Latch circuits 90 and 92 are composed of two inverters which are a serial connected to each other and formed between an NMOS transistor 88 and the transfer line N03, the NMOS transistor 88 having a channel formed between the transfer line N03 and the power voltage Vcc and gate-inputting a reverse sinal $\overline{\phi\text{CT}}$ of the chip test enable signal. A PMOS transistor 94 has a channel formed between the transfer lines N01 and N04' and gate-inputs the data input signal DIN. An NMOS transistor 96 has a channel formed between the transfer line N04' and the ground voltage terminal GND and gate-inputs the reverse sinal φCT of the chip test enable signal. Latch circuits 98 and 100 are composed of two inverters which are parallel connected to each other in the transfer line N04. An NMOS transistor 102 has a channel formed between the transfer lines N02 and N05 and gate-inputs the data input signal DIN. An NMOS transistor 104 has a channel formed between the transfer line N05 and the power voltage terminal Vcc and gate-inputs the reverse sinal $\overline{\phi\text{CT}}$ of the chip test enable signal. Latch circuits 106 and 108 are composed of two inverters which are serial connected to each other in the transfer line N05. A PMOS transistor 110 has a channel formed between the transfer lines N02 and N06' and gate-inputs the data input reverse signal $\overline{\text{DIN}}$. An NMOS transistor 112 has a channel formed between the transfer line N06' and the ground voltage terminal GND and gate-inputs the reverse sinal φ$\overline{\text{CT}}$ of the chip test enable signal. Latch circuits 114 and 116 are composed of two inverters which are parallel connected to each other in the transfer line N06. The NMOS transistors 88, 96, 104, and 112 set up the initial values of the transfer lines N03, N04, N05, and N06. Further, in the operational characteristic of FIG. 7, it is noted that according to intention of a designer, the voltage level is provided to the data input lines DIN and $\overline{DIN}$ of FIG. 4 and the transfer lines N01 and N02 of FIG. 5 through the precharge circuit 36 of FIG. 7. During an normal operation, the reverse signal $\phi\overline{CT}$ of the chip test enable signal is maintained at the logic high level, thereby precharging the transfer lines N03, N04, N05, and N06, to the logic "high" level. In the above state, if the test operation of the chip is enabled, for example, in case that the data input line DIN is "1" during the write operation, the NMOS transistor 86 is turned on and thus the transfer line N01 become the logic "high" level. Then the PMOS transistor 110 is turned on and thus the transfer line N02 becomes the logic "low" level. In case that any word line is enabled and at the same time, in this word line, one or more memory cells are defective, the corresponding output appears at the bit line connected to the transfer line N01. Thereby, the transfer line N01 becomes the logic "low" level. From that, the transfer line N03 is changed to the logic "low" level like FIG. 5. Then, since the memory cell is not coupled to the word line in the transfer line N02 and thus the bit line control signal is not enabled, the state of the transfer line N02 is not changed. In the meantime, in case that the data input line $\overline{DIN}$ or the data input line DIN becomes the logic "low" level, it is easily expected that it is possible to obtain information on the defectiveness of the transfer line according to the common operational characteristic mentioned above.

Figure 8:
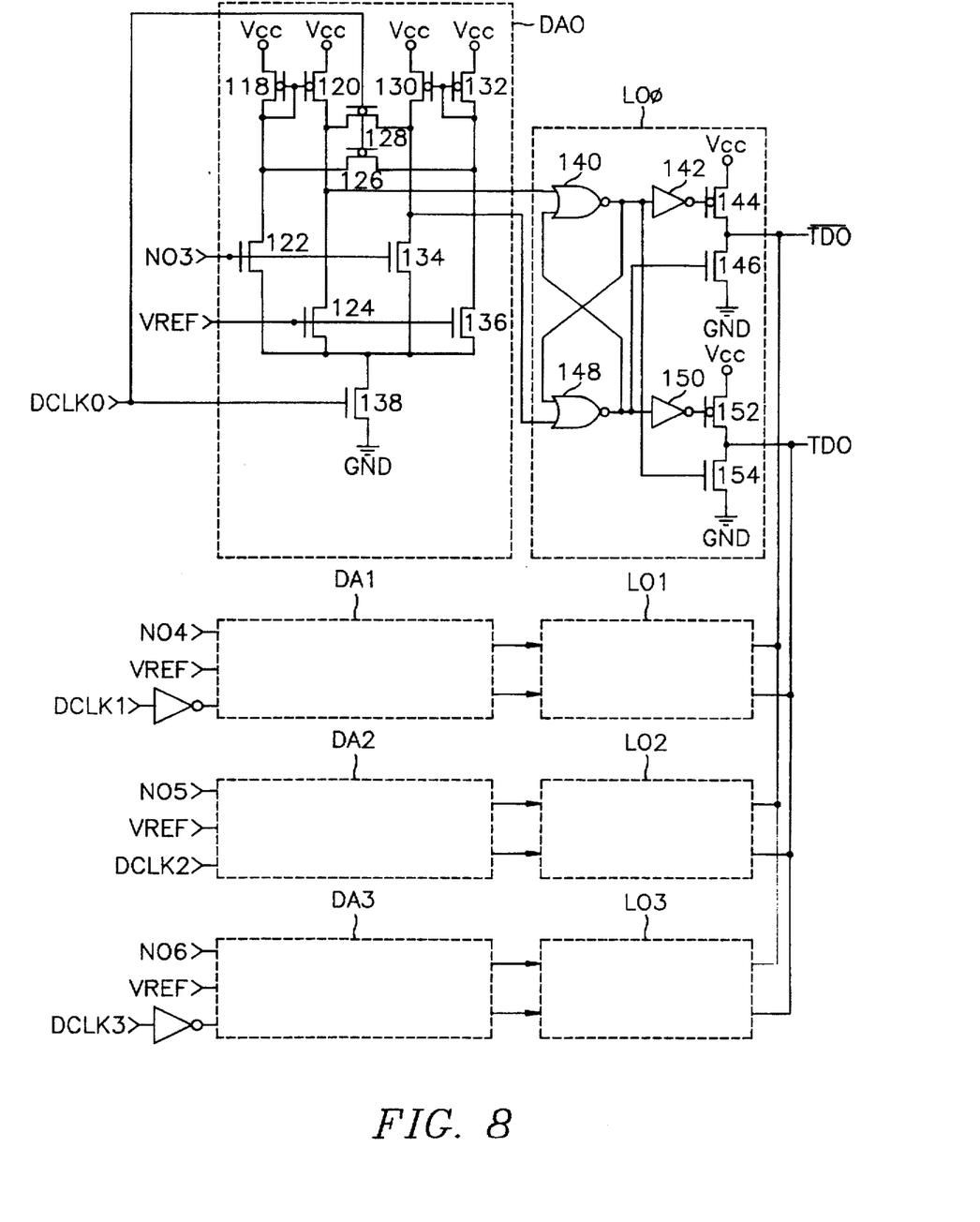
FIG. 8 is a circuit view showing an embodiment of an amplifier circuit 38 of FIG. 4.

FIG. 8 shows the embodiment of the amplifier circuit for amplifying defectiveness information detected from the precharge circuit 36 and then transferred and for outputting the information to the outside, i.e., a PAD. FIG. 8 consists of four differential amplifier circuits DA0, DA1, DA2, and DA3 and latch output stages LA0, LA1, LA2, and LA3 for latching and outputting the outputs of the differential amplifier circuits. The outputs of the latch output stages LA0, LA1, LA2, and LA3 are multiplexed and then are output as data output signals $\overline{TD0}$ and TD0 during the test operation. The differential amplifier circuit DA0 consists of two unit differential amplifier circuits which operate in response to inputs of the signal of the transfer line N03, a reference voltage signal VREF and a signal DCLK0 generated by delay of the bit line level detection control signal CLK0, the signal DCLK0 being embodied by including inverter chains in each of the output stages in FIG. 6. Output signals of the two unit differential amplifier circuits, i.e., 118, . . . , 124 and 138 and 130, . . . , 136 and 138, are output to the latch output stage LA0. The rest of differential amplifier circuits DA1, DA2, and DA3 are not shown in detail in FIG. 8 because only the input signals thereof are different from that of the differential amplifier circuit DA0 and the rest of constructions thereof are the same as those of the differential amplifier circuit DA0. In the same manner, this can be commonly applied to the latch circuits LA1, LA2 and LA3. As known, the four differential amplifier circuits DA0, DA1, DA2, and DA3 each input delay signals DCLK0, DCLK1, DCLK2, and DCLK3 of the bit line level detection control signals CLK0, CLK1, CKL2, and CLK3 of FIG. 6 and the transfer lines N03, N04, N05, N05, and N06 by ones. In the meantime, the reference signal VREF can use an output signal of a reference voltage generator disclosed in "Variable Vcc Design Techniques for Battery Operated DRAMs", on pages 110 to 111 of a Paper "Symposium on VLS Circuits Digest of Technical Papers" published 1992. The voltage level of the reference signal VREF is about ½ Vcc or about Vcc-nVth(n=0, 1, 2, . . . ). Further, regardless of the variation of the power voltage Vcc, the reference signal VREF maintains Vgs of the transistors and has other characteristics capable of reducing unnecessary current consumption, of minimizing noise and of maintaining constantly gap regardless of the variation of temperature. In the operational characteristic of FIG. 8, after the transfer lines N03, N04, N05, and N06 obtain somewhat of stable level, i.e., the voltage difference between the transfer lines and the reference voltage signal VREF, the delay signals of the bit line level detector control signals of FIG. 6 are used as the driving signals of the differential amplifier circuits so that the operations of the differential amplifier circuits can be performed at high speed. In the meantime, during the precharge operation, since the signals and DCLK2 are input at the logic "low" level, and the signals DCLK1 and DCLK3 are input at the logic "high" level a current source transistor (this is the same as the NMOS transistor 138 of the DA0) of the differential amplifier circuit is turned off and thus the differential amplifier circuit does not operate. Therefore, during the test operation, the data output signals $\overline{TD0}$ and TD0 output a signal set to the logic "high" level. As mentioned above, in this case, if one or more memory cells are defective, any one of the transfer lines N03, N04, N05, N06 of FIG. 7 is input at the "low" level. From that, any one of the four differential amplifier circuits DA0, DA1, DA2, and DA3 is coupled to one of the transfer lines and then is operated. Therefore, the data output signal $\overline{TD0}$ becomes the logic "high" level and the other data output signal TD0 becomes the logic "low" level by the differential amplifier operation of the differential amplifier circuit. Meantime, in case that there is no defectiveness in the memory cell, the data output signal $\overline{TD0}$ becomes the logic "low" level and the other data output signal TD0 becomes the logic "high" level.

Figure 9:
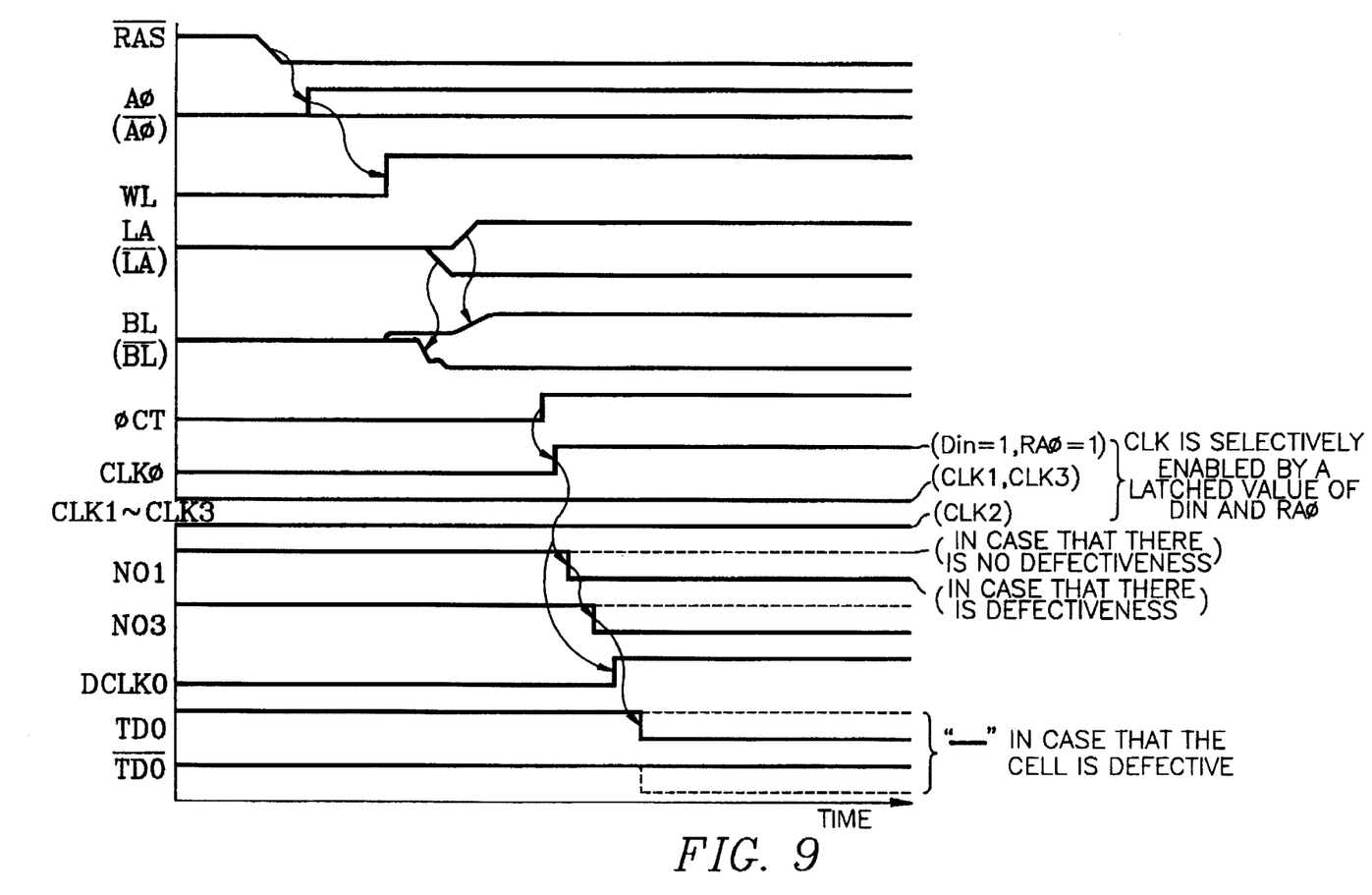
FIG. 9 is a timing diagram showing a process of enabling each of reference numerals of embodiments according to the construction of FIG. 4.

FIG. 9 is a timing diagram showing an process of enabling reference numerals of the embodiment according to the construction of FIG. 4. As stated above, signals LA and $\overline{LA}$ drive the bit line sense amplifier 12 shown in FIG. 2. As shown in timing diagram of FIG. 9, the embodiments of the test circuit show processes of reading data written in the memory cell and then compare-detecting it. With reference to the construction of the write circuit of FIG. 4, it is well known to one skilled in the art that the write operation is directly performed in the bit line through the write circuit 40 of FIG. 4 and the data input lines DIN and $\overline{DIN}$, unlike the conventional write operation that is performed in the bit line by turning on the column gate. On the other hand, in case that the DIN is connected to the transfer line N01 and the $\overline{DIN}$ to the transfer line N02, the operation to write any data in the bit line is performed as follows. For example, in case that the word line WL1 coupled to the bit line BL is enabled and "1" data is written in the memory cell connected to the word line WL1, the cell data is transferred to the bit line BL by the enable of the word line WL1 and the bit lines BL and $\overline{BL}$ are each developed to the power voltage Vcc and the ground voltage GND or the ground voltage GND and the power voltage Vcc by the bit level detecting operation. At this time if "1" data is written in the memory cell connected to the bit line BL, the bit line level detection control signals CLK0, and CLK3 are enabled in FIG. 6. Thereby, the only bit line BL having the cell "0" data is turned on with the transfer line N01 by the signal CLK0 and the bit line $\overline{BL}$ is turned on with the transfer line N02 by the signal CLK3, respectively. Therefore, in only case that the cell data is "0", a desired data "1" is written.

While there is shown and described the preferred embodiment of the present invention, it will be understood by those skilled in the art that foregoing and other change in form and details may be made without departing from the spirit and scope of the present invention. In special, the test circuit according to the present invention can be implemented without passing through the column gate and also can be implemented by the other method.

As mentioned above, the test circuit of the semiconductor memory device according to the present invention is capable of testing through the bit line whether or not the memory cell is defective without passing through the column gate. Thereby, it is possible to test the memory cell regardless of a switching operation of the column selection gate. Further, it is possible to the test at high speed the memory cell regardless of the number of data input/output lines. Therefore, the test circuit has an efficiency in that the test time of the semiconductor memory device is very reduced.

What is claimed is:

1. A semiconductor memory device having a memory cell, a cell array block in which said memory cell is arranged in matrix form, a word line selecting said memory cell in a direction of a row, a bit line selecting said memory cell in a direction of a column, a sense amplifier amplifying a voltage of said bit line, a data input/output line connected to said bit line for accessing data stored in said memory cell to an outside of a chip, and a column gate switch-connecting said bit line to said data input/output line and controlled by a column selection line, said semiconductor memory device comprising:

a test circuit including a bit line level detector connected to said bit line and detecting a voltage level of said bit line amplified by said sense amplifier, a bit line level detection controller for controlling an operation of said bit line level detector, and transfer means for transferring data transferred from said bit line level detector to said outside of said chip, whereby said test circuit tests whether said memory cell is defective or not.

2. A semiconductor memory device as claimed in claim 1, wherein said bit line level sensing circuit has a first switching transistor having a channel formed between said bit line and said transfer means and switch-operating in response to an output of said bit line level sensing control circuit, and means inserted between said first switching transistor and said transfer means and switch-operating in response to a voltage level of said bit line transferred through said first switching transistor.

3. A semiconductor memory device as claimed in claim 2, wherein said means inserted between said first switching transistor and said transfer means comprises a diode.

4. A semiconductor memory device as claimed in claim 2, wherein said bit line level sensing control circuit controls said bit line level sensing circuit, in response to each of inputs of a chip selection enable signal, a row address, and a data input signal.

5. A test circuit of a semiconductor memory device, comprising:

a bit line connected to memory cells;

a sense amplifier amplifying a voltage of said bit line;

a bit line level detector connected to said bit line for detecting a voltage level of said bit line amplified by said sense amplifier;

a bit line level detector for controlling an operation of said bit line level detector; and transfer means for transferring data transferred from said bit line level detector to an outside of a chip, whereby said test circuit detects said voltage level of said data transferred through said transfer means and then tests whether said memory cell is defective or not.

6. A test circuit as claimed in claim 5, wherein said bit line level sensing circuit has a first switching transistor having a channel formed between said bit line and said transfer means and switch-operating in response to an output of said bit line level sensing control circuit, and a diode transistor inserted between said first switching transistor and said transfer means and switch-operating in responding to said voltage level of said bit line transferred through said first switching transistor.

7. A test circuit as claimed in claim 6, wherein said bit line level sensing control circuit controls said bit line level sensing circuit, in response to each of inputs of a chip selection enable signal, a row address, and a data input signal.

8. A test circuit of a semiconductor memory device, comprising:

a bit line connected to memory cells;

a sense amplifier amplifying a voltage of said bit line;

a bit line level detector connected to said bit line for detecting a voltage level of said bit line amplified by said sense amplifier;

a bit line level detection controller for controlling an operation of said bit line level detector;

a precharge circuit for precharging an output line of said bit line level detector and for latch-outputting data transferred from said output line; and an amplifier circuit for producing a signal in response to an output signal of said bit line level detector, whereby said test circuit detects said voltage level of said data transferred through said amplifier circuit and then tests whether said memory cell is defective or not.

9. A test circuit as claimed in claim 8, wherein said bit line level sensing circuit has a first switching transistor having a channel formed between said bit line and said transfer means and switch-operating in response to an output of said bit line level sensing control circuit, and a diode transistor inserted between said first switching transistor and said transfer means and switch-operating in responding to said voltage level of said bit line transferred through said first switching transistor.

10. A test circuit as claimed in claim 9, wherein said bit line level sensing control circuit controls said bit line level sensing circuit in response to each of inputs of a chip test enable signal, a row address, and a data input signal.

11. A test circuit as claimed in claim 8, wherein said precharge circuit comprises:

a first switching transistor having a channel formed between said output line of said bit line level sensing circuit and a first transfer line connected to said amplifier circuit and gate-inputting a first data input signal;

a first precharge transistor having said channel formed between said first transfer line and a power voltage terminal and gate-inputting a reverse signal of said chip test enable signal;

a first latch circuit formed on said first transfer line;

a second switching transistor having said channel formed between said output line of said bit line level sensing circuit and a second transfer line connected to said amplifier circuit and gate-inputting a reverse signal of said first data input signal;

a second precharge transistor having said channel formed between said second transfer line and a ground voltage terminal and gate-inputting said reverse signal of said chip test enable signal; and a second latch circuit formed on said second transfer line.

12. A test circuit as claimed in claim 11, wherein said amplifier circuit has a first differential amplifier circuit for amplifying a signal input from said first transfer line, a first latch output part for latch-outputting an output signal of said first differential amplifier circuit to an outside of a chip, a second differential amplifier circuit for amplifying a signal input from said second transfer line, and a second latch output part for latch-outputting an output signal of said second differential amplifier circuit to said outside of said chip.

13. A test circuit of a semiconductor memory device, comprising:

a bit line connected to memory cells;

a sense amplifier amplifying a voltage of said bit line;

a write circuit for writing a predetermined input data in said memory cells during testing of a chip;

a bit line level detector connected between an output line of said write circuit and said bit line for detecting a voltage level of said bit line amplified by said sense amplifier when a reading operation for testing is performed, and for transferring said input data to said bit line when a writing operation for testing is performed; and a bit line level detection controller for controlling an operation of said bit line level detector;

whereby said test circuit detects the voltage level of said bit line responsive to the voltage level of said input data provided from said write circuit and then tests whether said memory cell is defective or not.

14. A test circuit as claimed in claim 13, wherein said bit line level sensing circuit has a first switching transistor having a channel formed between said bit line and said transfer means and switch-operating in response to an output of said bit line level sensing control circuit, and a diode transistor inserted between said first switching transistor and said transfer means and switch-operating in response to said voltage level of said bit line transferred through said first switching transistor.

15. A test circuit as claimed in claim 14, wherein said bit line level sensing control circuit controls said bit line level sensing circuit in response to each of inputs of a chip test enable signal, a row address, and a data input signal.

* * * * *